(12) United States Patent
Stemmer

(10) Patent No.: US 8,183,865 B2
(45) Date of Patent: May 22, 2012

(54) MAGNETIC RESONANCE SYSTEM AND METHOD FOR CORRECTION OF MOVEMENT ARTIFACTS

(75) Inventor: Alto Stemmer, Abenberg (DE)

(73) Assignee: Siemens Aktiengesellschaft, Munich (DE)

( * ) Notice: Subject to any disclaimer, the term of this patent is extended or adjusted under 35 U.S.C. 154(b) by 1006 days.

(21) Appl. No.: 12/143,227

(22) Filed: Jun. 20, 2008

(65) Prior Publication Data

US 2008/0317315 A1 Dec. 25, 2008

(30) Foreign Application Priority Data

Jun. 21, 2007 (DE) .......................... 10 2007 028 660

(51) Int. Cl.
*G01V 3/00* (2006.01)
(52) U.S. Cl. ........................ 324/309; 324/306
(58) Field of Classification Search .................. 324/309, 324/307, 306
See application file for complete search history.

(56) References Cited

U.S. PATENT DOCUMENTS

| | | | |
|---|---|---|---|
| 6,924,643 B2 | 8/2005 | Sussman et al. | |
| 7,012,603 B2 * | 3/2006 | Chen et al. | 345/419 |
| 7,308,125 B2 * | 12/2007 | Atkinson | 382/131 |
| 7,348,776 B1 * | 3/2008 | Aksoy et al. | 324/307 |
| 2001/0005135 A1 | 6/2001 | Thesen | |
| 2007/0031017 A1 | 2/2007 | Gundel | |

FOREIGN PATENT DOCUMENTS

| | | |
|---|---|---|
| DE | 103 19 037 | 11/2004 |
| JP | 9-29934 A | 11/1997 |
| WO | WO 01/84172 A1 | 11/2001 |

OTHER PUBLICATIONS

"Motion Correction with Propeller MRI: Application to Head Motion and Free-Breathing Cardiac Imaging," Pipe, Magnetic Resonance in Medicine, vol. 42 (1999) pp. 963-969.

\* cited by examiner

*Primary Examiner* — Louis Arana
(74) *Attorney, Agent, or Firm* — Schiff Hardin LLP

(57) ABSTRACT

In a method and magnetic resonance (MR) for correction of movement in the acquisition of MR images of an examination region, wherein the movement that occurs between the acquisition of data of spatially different slices of the examination region is taken into account, data from the examination region are acquired in multiple slices that are acquired in at least two groups, with slices of a second group arranged at least partially between slices of the first group, such that at least one slice of the second group lies between slices of the first group. Correction for movement of the examination region that occurred between the acquisition of data of the slices of the first group and the acquisition of data of an intervening slice of the second group is done by reconstructing a reference data set for the intervening slice from acquired slice data of the first group for the movement correction. This reference data set is compared with data of the acquisition of the MR image of the intervening slice in order to determine and correct the occurred movement.

24 Claims, 8 Drawing Sheets

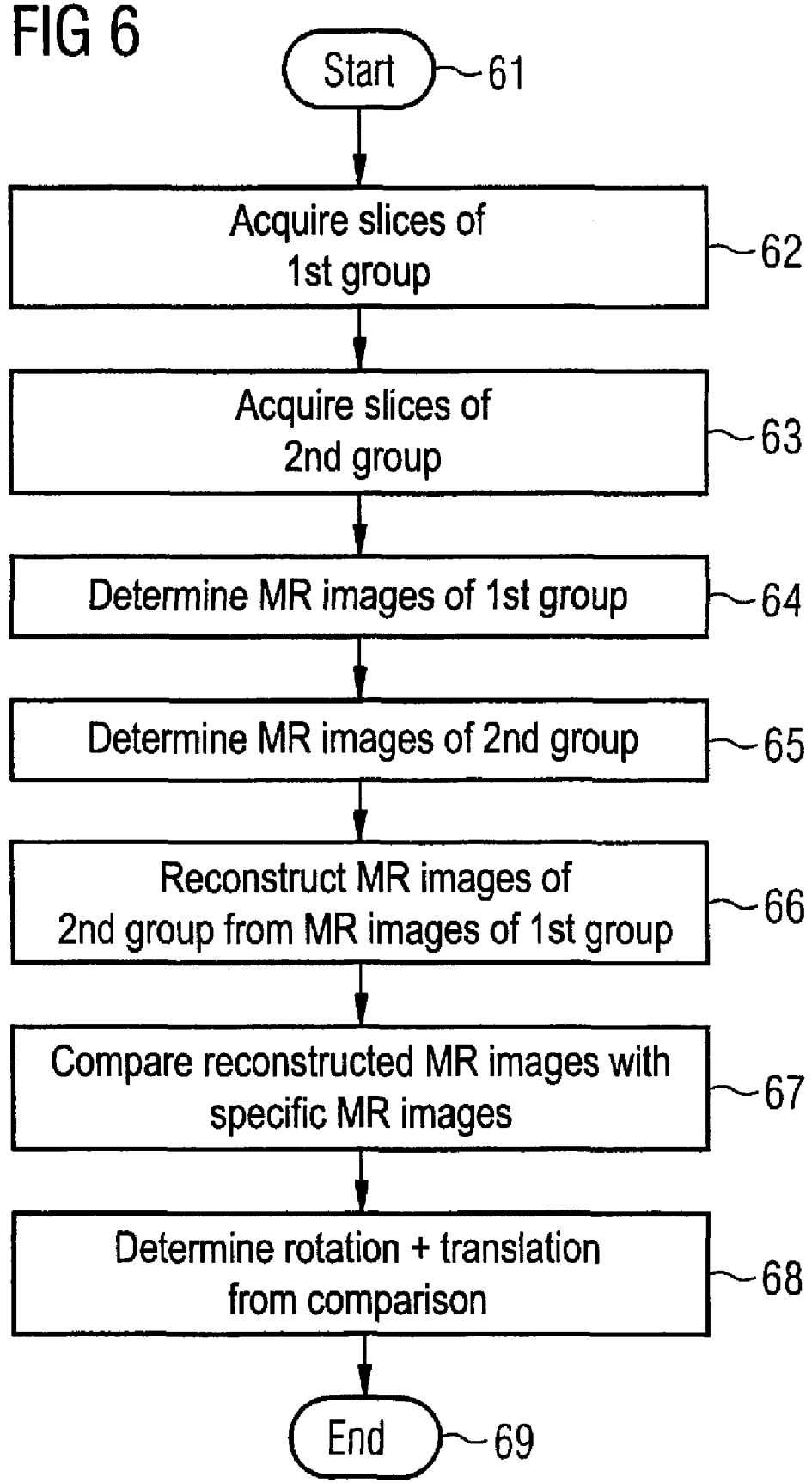

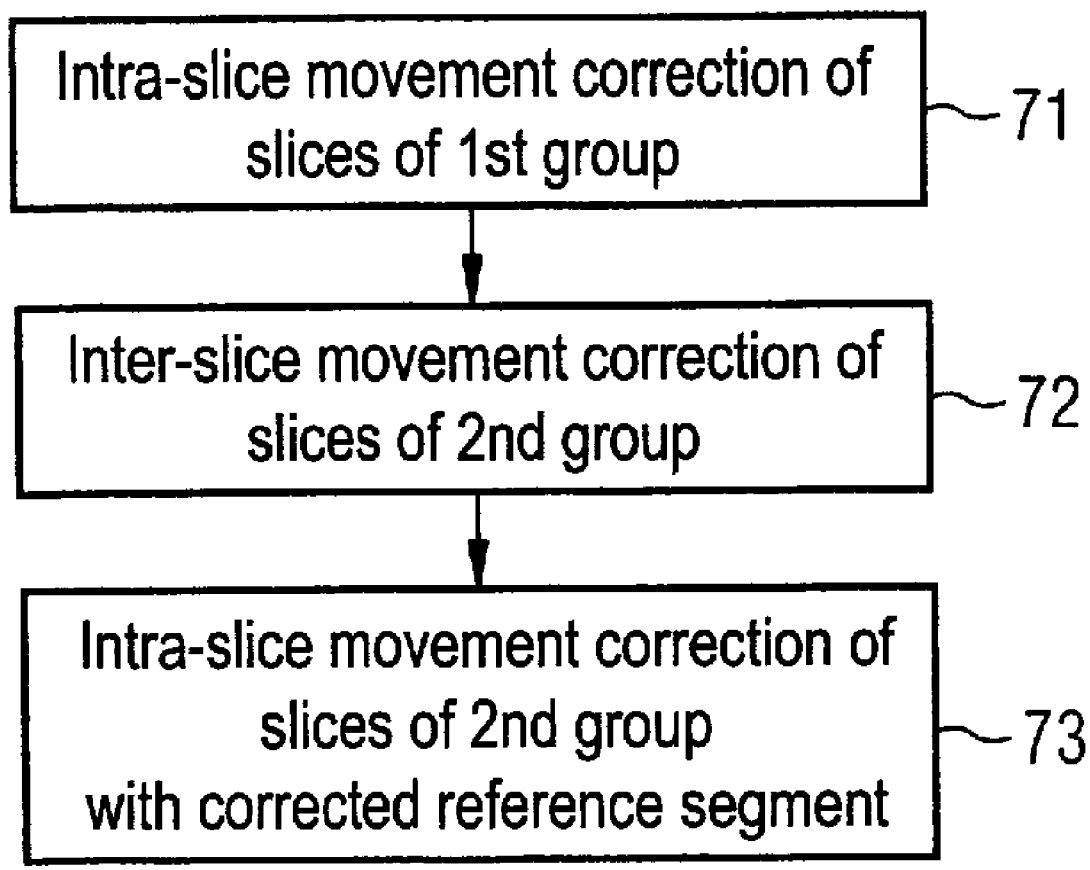

FIG 8A
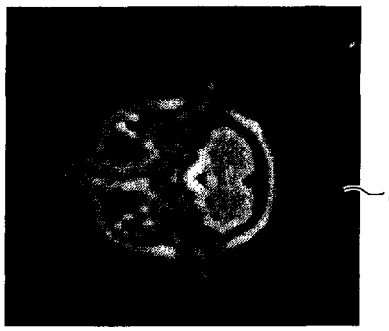
81
FIG 8B
82 83 84
 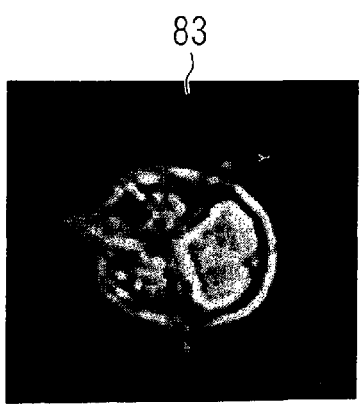 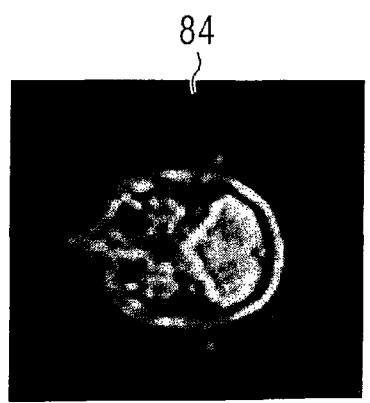
FIG 8C
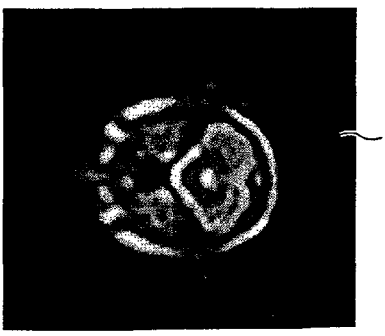
85
FIG 8D
86 87 88
  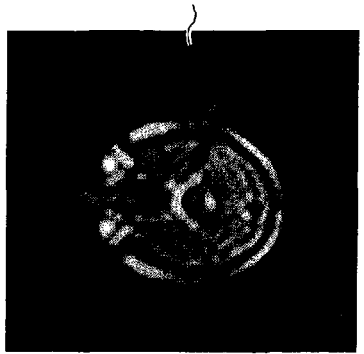

MAGNETIC RESONANCE SYSTEM AND METHOD FOR CORRECTION OF MOVEMENT ARTIFACTS

BACKGROUND OF THE INVENTION

1. Field of the Invention

The present invention concerns a method for correction of movement in the acquisition of MR (magnetic resonance) images and an MR system for this. The invention can in particular (but not exclusively) be used in the acquisition of MR images of the head. The invention can be applied in any other body region that is intrinsically rigid but is possibly subject to a translation or rotation movement.

2. Description of the Prior Art

In imaging by means of magnetic resonance, movement of the examination subject during the signal acquisition typically leads to artifacts in the image that are more or less noticeable in a disruptive manner in the interpretation of the MR images. Such movement artifacts can include artifacts due to movement of the examination subject that result in the acquisition of a single MR image (i.e. one slice). This is subsequently classified as an intra-slice movement that results given the acquisition during one slice. In addition to this intra-slice movement, inter-slice movement can occur, which is movement that occurs in the time span that arises between the acquisition of various slices at different locations. For example, movement in the acquisition of a single slice leads to signal loss, signal smearing in the image, or to what are known as ghost artifacts. Various methods exist for correction of these movement artifacts. For example, translation and rotation movements of a rigid body that occur in an image plane are suppressed in the imaging, as is described (among other things) by James G. Pipe in "Motion Correction with Propeller MRI: Application to Head Motion and Free-Breathing Cardiac Imaging", Magnetic Resonance Medicine 42:963-969, 1999.

Inter-slice movements influence the acquired MR images such that the acquired anatomy in adjacent slices is not aligned on one another but rather is shown offset or rotated by an angle. Since the physician who "leafs through" the images normally examines the images in anatomical order given exposures in multiple slices, a translationally offset slice or a slice rotated by an angle is very disruptive for the assessing physician.

A theoretical possibility to reduce such movement artifacts is to reduce the time interval in the acquisition of two adjacent slices, but this has the following disadvantage. Given the excitation of adjacent slices in short succession, a perfect, rectangular slice profile is not always excited by a selected radio-frequency excitation pulse (RF pulse). Each RF excitation pulse thus unavoidably also influences the slices adjacent to the excited slice. If the adjacent slices are now themselves excited before the excitation induced by the adjacent slice has decayed, the contrast is altered. One way around this is an acquisition method in which the slices are not excited one after another in their anatomical order; but instead, for example, one slice is respectively skipped. In this case this means that only every other slice is excited while the previously omitted slices are excited at a later point in time. Such acquisition methods afford the possibility to either first entirely acquire all slices of a first group (i.e. for example the slices 1, 3, 5, . . . ) and afterwards the remaining slices of a second group (i.e. the slices 2, 4, 6, . . . ). The complete acquisition of a slice thus generally requires multiple excitations. As an alternative, the slices of the first group and the second group can be acquired interleaved with one another, wherein after the acquisition of a first part of the first slice and before a further excitation of the first slice, a first part of the adjacent slice of the second group is acquired within the repetition time TR, for example. The repetition time TR is approximately 4-12 seconds given T2-weighted exposures of the head. In the last cited example of the interleaving, the time interval between the excitation of adjacent slices is approximately TR/2 (i.e. 2-6 seconds). For the other acquisition schemes in which one group is first entirely acquired before the next group is acquired, the time interval between corresponding excitations of two adjacent slices lies in the minute range. In both acquisition techniques, however, the time span that elapses between the acquisition of adjacent slices is not negligible. In the event that the examination region moves within this time span, this leads to a shift of the shown examination region in the image.

Techniques in order to reduce movement artifacts that arise during the acquisition of a slice are known in the prior art (see the preceding aforementioned publication by James G. Pipe, "Periodically Rotated Overlapping Parallel Lines with Enhanced Reconstruction (PROPELLER) MRI; Application to Motion Correction", MRM 42:963-969, (1999)). Such intra-slice movement corrections, however, cannot be used for correction of movement artifacts that result from movement between the acquisition/excitation of various anatomical slices.

SUMMARY OF THE INVENTION

It is an object of the present invention to provide a method and an MR system in which inter-slice movements can be corrected.

According to a first aspect of the invention, this object is achieved by a method for correction of inter-slice movement artifacts, wherein MR images of an examination region are acquired in multiple different slices and wherein these slices, or the associated MR images, are acquired in at least two groups. The slices of the second group are spatially arranged such that at least one slice of the second group lies between slices of the first group. To correct the movement of the examination region that occurred between the acquisition of slice data of the first group and the acquisition of slice data of an intervening slice of the second group, a reference data set for at least one intervening slice of the second group is reconstructed from the acquired slice data of the first group for the movement correction. This reference data set is then compared with data of the actual acquisition of the MR image of this intervening slice. Through this comparison, any movement that has occurred is determined and subsequently corrected. The present invention is based on the fact that, given such an acquisition method with two groups, the slice data of a group are acquired in very quick temporal succession. The time interval between the excitation of two slices of the same group is limited at the lower end by the duration of a single echo train. The duration of an echo train lies in the range from a few milliseconds to a few hundred milliseconds. The movement of the examination region (i.e. the patient movement within this time interval) can generally be ignored, from which it can be concluded that the movement between the acquisition of two adjacent slices of a group can be ignored. Furthermore, with the present invention it is presumed that adjacent slices of a group are anatomically very similar and do not differ entirely from one another. A further feature of the method according to the invention lies in that it delivers particularly advantageous results given the movement of rigid bodies. This means that the acquired examination region does not change its shape; rather, essentially only a rigid translation and/or rotation movement of the acquired body exists.

The slices of the first group and the slices of the second group are advantageously arranged in spatial alternation. For example, this means that the first, third, fifth, seventh, . . . slice in spatial succession belongs to the first group while the second, fourth, sixth, . . . slice belongs to the second group. However, the invention is not limited to two groups. An application with a first group consisting of the first, fourth and seventh slice, a second group consisting of the second, fifth and eighth slice and a third group consisting of the third, sixth and ninth slice is also possible. As noted above, the present method delivers the best results when the slices of the first group the data of which are used for the reconstruction of the reference data set for the intervening slice of the second group, show anatomically very similar structures. This can be achieved when the two directly adjacent slices of the first group are used for the reconstruction of the reference data set of the slice of the second group. For example, this means that the data of the first slice and the third slice (of the first group) are used for the generation of a reference data set for the second slice, and so on. Given use of the method with more than two groups it is also possible to use not the two directly adjacent slices but rather also further removed neighbors such as, for example, the data of the slices one and four for the reference data set of the second slice given allocation of the slices into three groups.

According to an embodiment of the invention, the slices of the first group are acquired before the slices of the second group. In this embodiment the time interval between the acquisition of directly adjacent slices is large, in the range of minutes, such that here the correction of the movement artifacts according to the invention can play a large role. In another embodiment the slices of the first group are acquired interleaved with the slices of the second group. In this method at least one partial data set of a slice of the second group is acquired between the acquisition of partial data sets of slices of the first group. In this case the time interval between the data acquisition of directly adjacent slices of the two different groups is approximately equal to half the repetition time TR, wherein the repetition time is the time span between two successive excitations of the same slice. For T2-weighted imaging sequences in the head, the repetition time is approximately 4-12 seconds. In this case the time interval between the excitation/data acquisition of directly adjacent slices is then approximately 2-6 seconds.

A correction of the translation and/or rotation movement of the examination region that occurs in the time span between the acquisition of data of the two MR images of the first group and the acquisition of data of the intervening slice of the second group can in particular occur with the present method.

According to an embodiment of the invention, the MR images are acquired with a radial acquisition technique in which k-space or raw data space for each MR image is sampled (filled) in multiple segments of a predetermined width, wherein each segment proceeds through the k-space center. An intersection region that is acquired by each segment thus results in k-space. This property of the k-space trajectory is utilized for the intra-slice movement correction insofar as the acquisition of an individual k-space segment ensues quickly relative to typical patient movement. Given absence of patient movement, the data in the intersection region of two different segments of the same slice are, to a first approximation, identical after correction of the known rotation angle between the segments. If a patient movement occurs between the acquisition of the two segments, the data in the intersection region deviate from one another. The patient movement that occurred between the acquisition of the two segments can be calculated from this deviation (i.e. via the comparison of the data in the intersection region) insofar as the patient movement significantly occurred in the slice plane. Given known movement, the data of one of the two segments can be correspondingly corrected before the superimposition of the segment data in k-space and thus, in spite of movement, sharp images can be calculated. This method cannot be directly transferred to the inter-slice movement correction since the data in the intersection region of the segments of various slices are different from one another even in the absence of patient movement. This problem is solved in the first embodiment of the invention in that an artificial reference data set for an intervening slice of the second group is calculated from segment data of slices of the first group such that the reference data approximately correspond (at least in the intersection region of the segments) to the segment data of the intervening slice of the second group at the point in time of the acquisition of the segments of the first group. By comparing the actual measured segment data of the intervening slice of the second group in the intersection region with the corresponding data of the reference data set, the patient movement that occurs between the acquisition of the acquisition of this segment of the intervening slice of the second group and the acquisition of the segments of the first group from which the reference data set was generated can be determined. This is the sought-for inter-slice movement that now can be corrected with the same methods as are used for intra-slice movement correction. The decisive step for a successful implementation of the inventive method is thus the generation of the artificial reference data set for the intervening slice of the second group. For this purpose, only such segments of the first group that were measured in immediate temporal succession should be used in order to obtain a movement-free reference data set. The simplest method is the linear interpolation from segments of both slices of the first group that are directly adjacent to the slice of the intervening slice of the second group. For this purpose, the corresponding data of the two segments are added and the result is divided by two. If the aforementioned requirements are satisfied, a reference data set that is sufficiently good for the inter-slice correction is already obtained. Any method that can approximately interpolate an image at an inter-slice position from a stack of two-dimensional images can be used as an alternative to the linear interpolation. Such methods are known in the literature and are used, for example, in the 3D visualization of stacks of two-dimensional images. Many of these methods operate in image space. This is not a hindrance since each segment acquires the k-space center. The segments of the slices of the first group that are drawn upon to form the reference data set can therefore be transformed into image space via a two-dimensional Fourier transformation per segment. A stack of two-dimensional images is thereby obtained. The interpolation methods can be applied to this slice stack in order to generate an image at the site of the intervening slice of the second group. Insofar as the movement detection ensues in k-space, this image can be transformed back into k-space with a two-dimensional inverse Fourier transformation.

In the previously described embodiment the reference data set was generated from a partial range (region) of the k-space data of adjacent slices. In another embodiment it is also possible to use the high-resolution MR images of the first group (or the k-space data of these images) itself for the generation of the reference data set. In this case the high-resolution MR images of the first group are used to reconstruct the reference data set of the intervening slice of the second group, and the reference data set can in turn be generated via (for example) the linear interpolation of the two adjacent, high-resolution MR images.

The inter-slice movement correction described above can be implemented alone; it can also be used in connection with the intra-slice movement correction. Intra-slice movement correction methods are known in the prior art through the publication by James G. Pipe described above. It is now possible to implement an intra-slice movement correction in the slices of the first group, with this movement correction correcting the movement within a time span that results for the measurement of data of a slice. The intra-slice movement correction of a slice of the second group can then likewise be corrected, for example by comparison of each segment of this slice with a reference segment of this slice, with the reference segment of this slice being adapted to the reconstructed segment of this slice that is calculated during the inter-slice movement correction. The segments of the slices of the first group that are also used as a reference segment for the intra-slice movement correction of the slices of the first group is thereby used for generation of the reference data set of the intervening slice of the second group.

The invention likewise concerns an MR system for implementation of the movement correction method described above. Such an MR system has an image acquisition unit for generation and acquisition of magnetic resonance signals of an examination region, and the image acquisition unit also reconstructs MR images of the acquired MR signals. The image acquisition is controlled such that the examination region is acquired in multiple slices via at least two groups, with slices of a first group arranged around at least one slice of a second group such that this slice of the second group lies between slices of the first group. The MR system furthermore has a movement correction unit that corrects the inter-slice movement in that it reconstructs a reference data set for the intervening slice from acquired slice data of the first group and compares this reference data set with data of the acquisition of the MR image of this intervening slice for which the reference data set was generated, and the occurred movement is calculated from this. The movement correction unit can include a comparison unit that compares the reference data set for the intervening slice with the measured data of the same slice that was acquired at a later point in time, with the translation and/or rotation movement of the examination region being subsequently determined at a later point in time.

BRIEF DESCRIPTION OF THE DRAWINGS

FIG. 6 is a further flowchart of another embodiment for movement correction according to the invention.

FIG. 7 is a flowchart that shows the correlation between an inter-slice movement correction and intra-slice movement correction.

FIGS. 8A-8D illustrate the movement correction according to the invention using example MR images.

DESCRIPTION OF THE PREFERRED EMBODIMENTS

Figure 1:
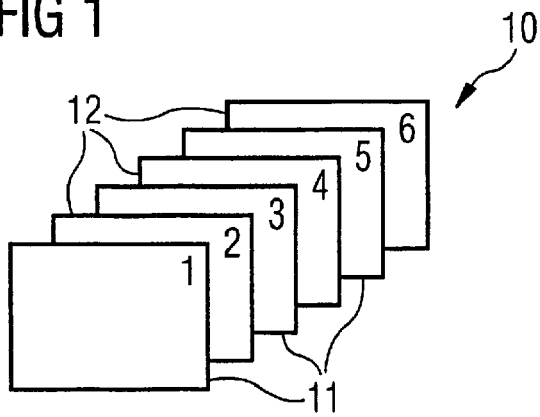
FIG. 1 schematically illustrates the acquisition of multiple slices in two different groups.

Various MR images are schematically shown in FIG. 1. Various slices 10 are acquired from an examination region (not shown), wherein the various slices 10 present the examination region in successive anatomical order. In one embodiment of the invention, the slices 10 are not acquired in succession dependent on their spatial position, rather the slices are divided into two different groups; for example, the slices of the first group 11 and the slices of the second group 12 exist. As mentioned above, for many application cases it is advantageous not to measure directly adjacent slices in direct succession, since an excitation of nuclear spins in the adjacent slice cannot be entirely precluded given the excitation of the nuclear spins in a slice. For this reason, for example, the slices of the first group (i.e. in the shown example the slices one, three and five) are measured and the slices of the second group (the slices two, four and six in the shown example) are measured at a later point in time. These MR images can be acquired with the MR system 100 schematically depicted in FIG. 10. The design of the MR system essentially corresponds to the design of a conventional MR system. A basic field magnet 110 generates a temporally constant strong magnetic field for polarization or, respectively, alignment of the nuclear spins in the examination region of a subject such as, for example, a part of a human body 111 to be examined. The examination region on a patient bed 112 is shifted into the basic magnet 110 until the region to be examined comes to lie in the magnet center at which an optimal spatial homogeneity of the magnetic field exists. Furthermore, a gradient coil system (not shown) is provided in the basic magnet 110. This gradient coil system generates linear gradient fields in the various directions of a Cartesian coordinate system. A radio-frequency antenna of the MR system 100 is furthermore provided that radiates radio-frequency pulses (RF pulses) to excite the nuclei and align the nuclear spins of the subject to be examined in the examination subject. The alternating field emanating from the precessing nuclear spins is detected by a radio-frequency antenna (not shown) as a voltage signal and is subsequently demodulated in an acquisition system of the MR system and processed further in a central control unit 120. In image acquisition unit 125 that is responsible for the generation of the MR images using the acquired MR signals is provided in the central control unit 120, wherein the image acquisition unit likewise monitors the control of the slice sequence as shown in FIG. 1. When MR images are now acquired by the image acquisition unit 125 in multiple slices of an examination subject, wherein the multiple slices are acquired in different groups as shown in FIG. 1, different movements of the examination region can occur. A movement correction unit 128 corrects the movement that the examined person executes during the acquisition of the various slices 10 from FIG. 1. For this the movement correction unit possesses a comparator 129 in which (as explained later) a reference data set of a slice is compared with the actual measured MR data in order to infer the movement that occurs in the time span from the measurement of the one slice and the measurement of a further slice. The MR images can be displayed for assessment on a display unit 130. The basic functionality of an MR system for generation of MR images is known to those skilled in the art, such further specification of the basic components in detail is not necessary. The movement correction by the movement correction unit that is essential to the invention is subsequently described in detail with reference to FIG. 2-9.

Figure 2:
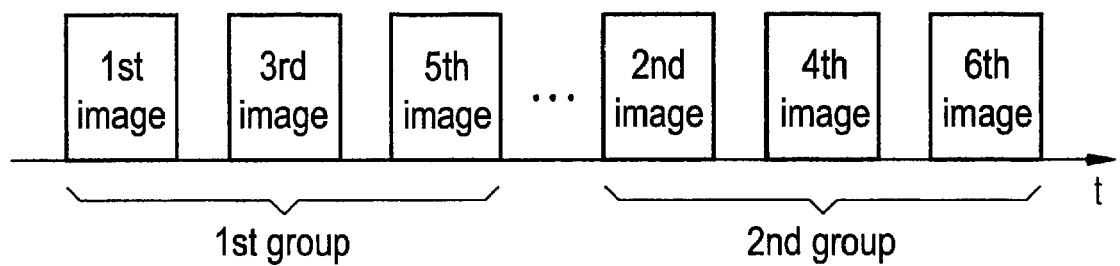
FIG. 2 illustrates a first example of a sequence of the acquisition of the two groups.
Figure 3:
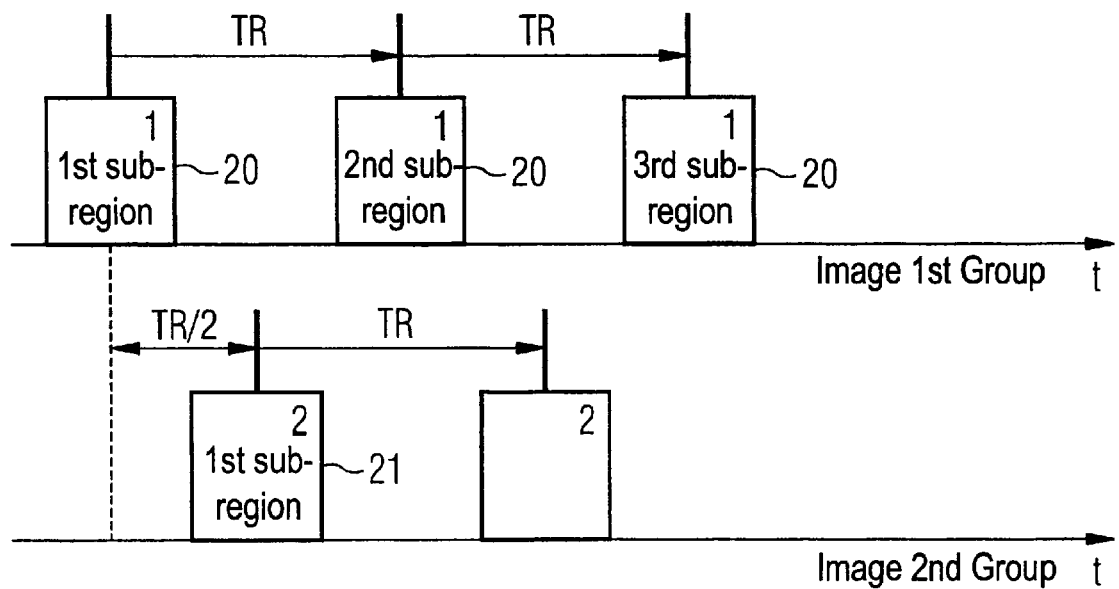
FIG. 3 illustrates a further example of the sequence for the acquisition of the two groups.

The different groups 11 and 12 shown in FIG. 1 can now be acquired in a temporal sequence as they are presented in FIG. 2 or FIG. 3. In the embodiment shown in FIG. 2 the sequence of the acquisition of the various slices ensues such that the images of the first group 11 are all acquired first. In the shown example these are all slices or, respectively, images with odd slice number. If all odd slices have been acquired, the second group with the even slice numbers is subsequently acquired. The total time for acquisition of all slices is the acquisition time TA. As can be seen from the example of FIG. 2, the time span between the acquisition of the first acquired data of an image of the second group (for example the image 2) and the point in time of the first data of the two adjacent images 1 and 3 is then approximately half of the acquisition time. A first acquisition scheme for acquisition of the various MR images 10 is shown in FIG. 3. In this example the images are acquired interleaved insofar as that various segments 20 of an image of the first group (for example of the first image) are acquired at a time interval of TR (TR designates the repetition time). TR is the time span between two successive excitations of the same slice, wherein a partial data set (i.e. segment) of a slice is acquired in each excitation. Three different partial data sets or segments for the generation of the first MR image are shown on the upper time axis in FIG. 3. When the various partial data sets of the adjacent second image that is associated with the second group 12 are acquired is shown in the lower time bar. The time interval between the acquisition of successive partial data sets of a slice is again TR. The first excitation of the second slice 21 ensues approximately TR/2 after the first excitation of the first slice 20 so that the unavoidable excitation of the second slice has largely decayed at the excitation of the first slice and third slice. Since the present invention can be applied in the head region, since here the anatomy between successive slices changes only slightly, T2-weighted FLAIR sequences can be used (FLAIR stands for Fluid Attenuated Inversion Recovery). TR for these T2-weighted FLAIR sequences is at least nine seconds, such that the minimal time interval between the acquisition of adjacent slices is not so slight that possible movements within TR/2 can be ignored. This applies all the more for the embodiment shown in FIG. 2 since here the time span between the measurement of the first image and that of the second image is even greater.

The present invention can also be applied in connection with the intra-slice movement correction. For this reason the movement correction which corrects movements that occur in the acquisition of a single slice during the acquisition time is subsequently explained in connection with FIG. 4.

Figure 4:
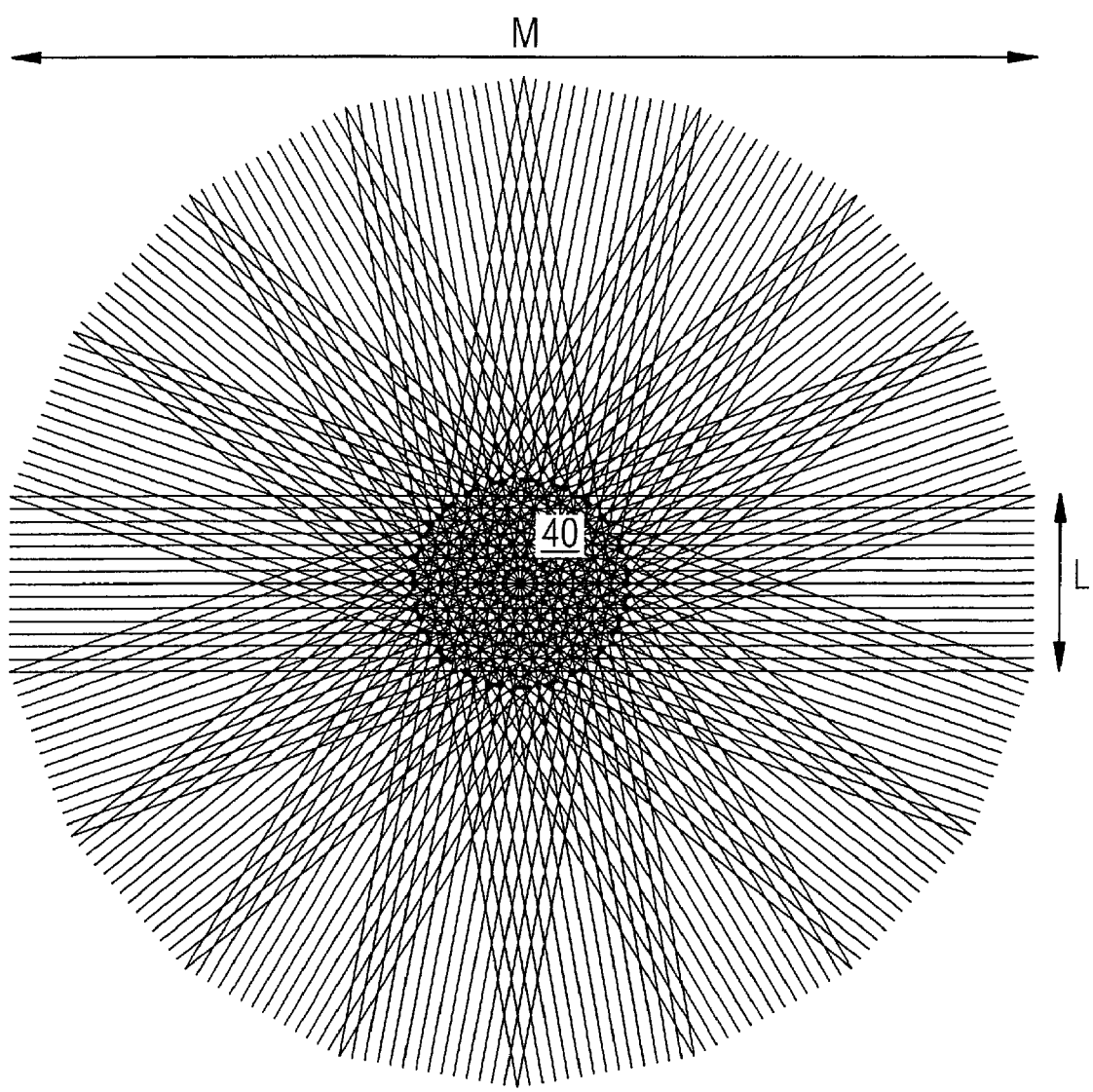
FIG. 4 shows the k-space trajectories in a PROPELLER imaging sequence in which k-space is acquired in different segments in a radial acquisition technique.

The acquisition technique in k-space is exemplarily presented in the PROPELLER technique that is described in the aforementioned publication by James Pipe. The steps of phase correction, rotation correction, translation correction, correlation weighting and concluding reconstruction are contained in such a PROPELLER technique. In one embodiment of the present invention the steps of rotation correction and translation correction are modified such that the inter-slice movement is likewise taken into account. As shown in FIG. 4, in the PROPELLER technique k-space is read out in different segments with the thickness L (with multiple phase coding steps and signal readout over the width M). In the embodiment shown in FIG. 4 the entirety of k-space is covered by nine different segments, wherein each segment runs through the k-space center and is shifted by a rotation angle relative to another segment. It can be seen in FIG. 4 that the dashed circle shown in the center (what is known as the intersection region 40) is acquired by all segments. The intersection region 40 is acquired by each segment [sic]. If it is now presumed that each segment is acquired quickly enough that the movement in the acquisition of a segment is negligible, an image for each segment can be reconstructed from the overlap region 40. If the examination subject is at rest, all images of the different segments should correspond to one another up to a known rotation angle α. If the examination subject now moves in the image plane between the acquisition of the various segments in the same slice, the images of the individual slices are replicas that have executed a rotation and translation movement. The comparison of the acquired MR data in the overlap region 40 thus enables the calculation of the patient movement in the plane that occurred between the acquisition of the individual segments of the slice. Such detection methods operate with an image pair $I_1(x, y)$ and $I_i(x,y)$. One of the two images is designated as a reference image and the object of the movement detection is to find a rotation angle $\theta_i$ and the translation parameters $\Delta x_i$, $\Delta y_i$ that align the second image $I_i(x,y)$ with the reference image $I_1(x,y)$. Mathematically, this fact is described as follows:

$$I_i(x,y) = I_1((x \cos \Theta_i + y \sin \Theta_i) - \Delta x_i, (-x \sin \Theta_i + y \cos \Theta_i) - \Delta y_i) \quad (1)$$

The method can now operate either in the image region or in k-space. The inverse Fourier transformation $s_1(k_x, k_y)$ of $I_1(x,y)$ and the inverse Fourier transformation of $s_i(k_x, k_y)$ of $I_i(x,y)$ relate as follows:

$$s_i(k_x, k_y) = e^{-j2\pi(\Delta y_i k_x + \Delta x_i k_x)} s_1((k_x \cos \Theta_i + k_y \sin \Theta_i), (-k_x \sin \Theta_i + k_y \cos \Theta_i)) \quad (2)$$

Further details can be learned from the cited publication by James Pipe.

Before the movement detection is implemented, the segments are filtered such that only data inside the intersection region 40 for each segment remain. This means:

$$s_i(k_x, k_y, n) = 0 \text{ when } \sqrt{k_x^2 + k_y^2} > L \quad (3)$$

Any intersection region of a segment can be used as a reference to calculate the intra-slice movement. For example, this can be the first segment $s_1(k_x, k_y)$ in the slice n. The pair $s_2(k_x, k_y, n)$ and $s_1(k_x, k_y, n)$ is now formed to detect the movement between the acquisition of the second segment and that of the first segment, wherein these two data sets are compared with one another in order to determine the movement of the examination subject in the acquisition of the two segments. The intra-slice movement can be determined and subsequently corrected with such a method. If this movement is now accounted for and corrected, this means that the inter-slice movement between two adjacent slices n and n+1 is the movement that occurred in the time span between the acquisition of the first segment $s_1(k_x, k_y, n)$ of the slice n and the first segment $s_1(k_x, k_y, n+1)$ of the slice n+1. This inter-slice movement correction is now explained in detail in connection with FIG. 5.

The method starts in Step 50. In a first step 51 the slices or, respectively, MR images of the first group 11 are acquired. In a preferred embodiment this is (as shown in FIG. 1) any second anatomically supported slice. The slices of the second group 12 that are omitted in Step 51 are acquired in Step 52. After the end of the acquisition of both groups, slices of the first group are then alternately arranged with slices of the second group. However, in another embodiment more than two groups can also be provided, with a first group with the slices one, four, seven, a second group with the slices two, five, eight and a third group with the slices three, six, nine.

The order of the slice acquisition can be as shown in FIG. 2, wherein first all slices of the first group are acquired and subsequently all slices of the second group. The slices of the two groups can likewise be acquired interleaved with one another as shown in FIG. 3. The time interval in the acquisition of directly adjacent slices can now be between a few seconds and multiple minutes, depending on the acquisition technique. It may be that the examination subject has moved. Without movement correction, for example, the examination region in slice 2 would now be shown in a different position than in slices 1 and 3. This is a hindrance for the assessing physician since he no longer comes across the sought anatomy at the same point. In order to now correct the movement that has occurred between the acquisition of the first slice and third slice as well as the acquisition of the second slice, in Step 53 the intersection region in k-space is now determined in one of the slices of the first group. It is hereby assumed that the image acquisition occurs in a radial acquisition technique in k-space. This can be the PROPELLER technique shown in FIG. 4, for example. However, a helical acquisition of k-space is likewise also conceivable. Given such radial acquisition techniques, the k-space center is acquired upon acquisition of each segment.

In order to now generally identify the movement that occurs between the acquisition of a first segment $s_1(k_x,k_y,n)$ of a slice in the second group and the acquisition of the first segments of the slices $s_1(k_x,k_y,n-1)$, $s_1(k_x,k_y,n+1)$ of the first group that are adjacent to n, in Step 54 the k-space data in the intersection region (for example region 40 from FIG. 4) are determined for the slice n−1. In Step 55 the k-space data in the intersection region for the slice n+1 are likewise determined. The slices n−1 and n+1 that belong to the slices of the first group are acquired with a very short time interval. This time span is limited only by the duration of a single echo train. The echo time (TE) (that is used for a T2-weighted acquisition of the head, for example) lies between 60 ms and 120 ms. In turbospin echo imaging sequences the TE time is defined as the time that the time interval takes between the excitation pulse and the echo with the lowest amplitude of the phase coding gradient. Given linear filling of k-space the duration of an echo train is therefore approximately 2TE, i.e. 120 to 140 ms. The movement of the examined person in this time interval can be ignored, such that it is presumed that the two slices n+1 and n−1 are anatomically aligned with one another in good approximation and no movement occurred. The method according to the invention was previously described in connection with radial acquisition techniques. However, as will be explained with FIG. 7, non-radial acquisition techniques can also be applied. In turbospin echo imaging methods or EPI sequences a segment means the acquisition of the data that are acquired after a single excitation. As will be explained later in connection with FIG. 6, the invention can also be applied in single shot echoplanar imaging (EPI), in which the entirety of k-space is read out after a single excitation. Given such acquisition techniques the movement that occurred upon acquisition of a slice can again be ignored due to the brevity of the acquisition duration, but not the movement that occurred between the acquisition of two different slices.

Referring again to FIG. 5, an artificial data set (what is known as the reference data set (Step 54) is again reconstructed for the slice n (Step 54). This reference data set for the slice n then shows approximately the anatomy at the position of the slice n as it existed at the point in time at which the slices n−1 and n+1 were acquired. In a next step 57 a data set for the intersection region is now determined again for the slice n from the data acquired in Step 52. The inter-slice movement can now be concluded via comparison of the reference data set that corresponds to a position of the examination region at the point in time of the acquisition of the slices n−1 and n+1 and the current position of the examination region at the point in time of the acquisition of the slice n. The comparison of the reference data set with the acquired data in Step 58 (which, for example, is effected in the comparator 129 from FIG. 10) can now be used overall in order to determine and reverse the rotation or translation movement of the acquired examination subject (Step 59).

Multiple methods are conceivable for reconstruction of the k-space data in slice n, i.e. the reference data set. For example, a simple linear interpolation step of the two nearest neighboring slices n+1 and n−1 can be applied:

$$s_0(k_x, k_y, n) = \frac{s_1(k_x, k_y, n-1) + s_1(k_x, k_y, n+1)}{2} \quad (4)$$

A number of interpolation methods for how intervening slices are reconstructed for a stack of two-dimensional slices for 3D applications have been developed in computer tomography (CT) and magnetic resonance tomography (MRT). The resolution in the slice direction given a stack of two-dimensional slices is typically considerably poorer than the resolution within the slice. However, an isotropic pixel resolution is necessary for a 3D presentation of a stack of 2D slices so that in this case multiple slices must be estimated and generated in the slice direction. Interpolation methods in the prior art are known from such methods. These methods can likewise be used in addition to the method just described of linear interpolation between the slice n+1 and n−1. As follows from the above equation, the interpolation can directly ensue in k-space without implementing a Fourier transformation in image space. However, in the event that an interpolation method is used that can operate only in the image region, the segments of the slices of the first group that are used for generation of the reference data for slice n can thus also first be Fourier-transformed in order to form a stack of image slices. The interpolation then ensues in the image region to generate the reference data or, respectively, reference images. For the actual movement detection and correction the reference data set is now compared with the acquired data set and from this the translation and rotation are calculated, as was described above in connection with the intra-slice movement detection. For example, the reference data set can be generated in the movement correction unit 128 while the reference data set is compared in the comparator with the acquired data set in order to thereupon determine the translation $\Delta x_i$, $\Delta y_i$ and the rotation angle $\theta_i$. The movement detection can in turn operate with k-space data or with image space data. If the generation of the reference data sets now occurs in image space and the movement detection occurs in k-space, the generated reference data set images are transformed back again into k-space via inverse Fourier transformation in order to implement the movement detection there.

A second embodiment of the invention is described in connection with FIG. 6. In this embodiment the inter-slice movement correction is only implemented after the concluding reconstruction of the images. This means that the slices of the first group and the slices of the second group are acquired in Steps 62 and 63 after the start of the method Step 61. MR images are reconstructed in Steps 64 and 65 for the slices of the first group and for the slices of the second group. In this embodiment the high-resolution MR images can be used for the inter-slice movement correction. For this reference data sets are reconstructed in Step 66 (analogous to the embodiment of FIG. 5), however this time starting from the completely reconstructed MR images or, respectively, the k-space data associated with these images. Given application of a linear interpolation technique this in turn means that a reference data set $\tilde{I}(x,y,n)$ that is reconstructed from the slices of the images of the first group is calculated for the intervening slice. Given linear interpolation, $\tilde{I}(x,y,n)$ is then calculated as follows:

$$\tilde{I}(x, y, n) = \frac{\tilde{I}(x, y, n-1) + \tilde{I}(x, y, n+1)}{2}, n = 2, 4, \ldots \quad (5)$$

In a next Step 67 the reconstructed MR images/k-space data can then be compared (in the comparator 129) with the MR images/k-space data acquired in Step 65. Starting from the comparison, the rotation and the translation of the acquired body can then be determined in turn in Step 68. For example, the images/k-space data of the second group are finally corrected with the aid of the result from Step 68 and therefore aligned relative to the images from the first group. The method ends in Step 69.

Whether the selected interpolation method and/or the movement detection and correction algorithm operates in k-space or in image space thereby plays no role since the image data can be transformed into the respective suitable space via inverse Fourier transformation or the k-space data can be transformed into the respective suitable space via Fourier transformation.

A further reconstruction step can be added to correct the inter-slice movement. In this step each image I(x,y,n) or, respectively, the k-space data corresponding to it of the second group is/are subjected to the movement correction with removal of the rotation and translation. The entire reconstruction of the slices of the second group is repeated as an alternative. In the second implementation of the reconstruction the inter-slice rotation component is added to the rotation angle (which in turn is composed of the acquisition angle of the segment as well as the rotation angle that was determined in the intra-slice movement detection) of each segment, and the translation vector of each segment is determined as the vector sum of the intra-slice movement. The first alternative with the addition reconstruction step has the disadvantage that the image rotation always comprises some interpolation steps, wherein each additional interpolation slightly adulterates the final image. The second alternative with the repeated complete reconstruction leads to an increased calculation effort.

Figure 5:
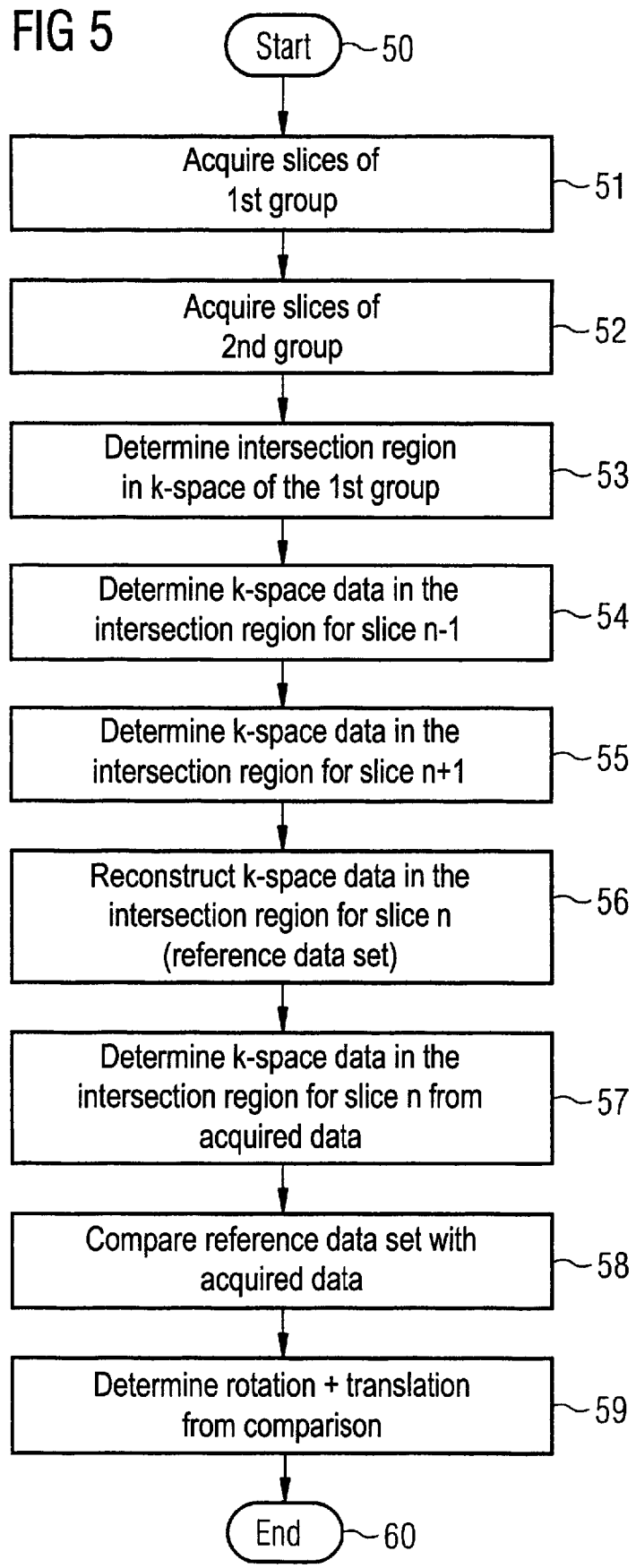
FIG. 5 is a flowchart of a first embodiment for movement correction according to the invention.

Relative to the embodiment shown in FIG. 5, the embodiment described in FIG. 6 has the advantage that it operates on complete, high-resolution images and therefore is more precise. As described in the preceding, this embodiment can be applied in non-radial symmetrical acquisition techniques of k-space but also in single shot methods such as HASTE/RARE, fast gradient echo or EPI sequences.

Overall the method described in FIG. 5 is less computationally intensive and also functions when the intra-slice movement correction is not possible.

Operation of the intra-slice movement correction and the inter-slice movement correction together is described in connection with FIG. 7. For example, in a Step 71 the intra-slice movement correction can be implemented for the slices of the first group as it was described at the beginning in connection with the PROPELLER technique. The inter-slice movement correction for the slices of the second group can subsequently be implemented in Step 72 as it was described in FIGS. 5 and 6. In the embodiment in FIG. 5 this means that the first segment of the slice n is aligned with the generated reference data set of this segment via rotation and translation in the plane before the intra-slice movement detection occurs. The rotation angle and the translation change for this alignment is the result of the inter-slice movement detection between the first segment $s_1(k_x,k_y,n)$ of the slice n and the generated reference data set $s_0(k_x,k_y,n)$ (Step 73). As an alternative, it is also possible to not align the reference segment before the intra-slice movement detection, wherein in this embodiment the inter-slice movement is added to the result of the intra-slice movement. A third alternative is the use of the reference data set $s_0(k_x,k_y,n)$ as a reference for the intra-slice movement detection of the slice n. However, this third alternative is not recommended since the generated reference data set of the segment is less precise than the actual acquired data set of this segment of the slice n. The insertion of the inter-slice correction would therefore potentially degrade the result of the intra-slice correction.

Figure 9:
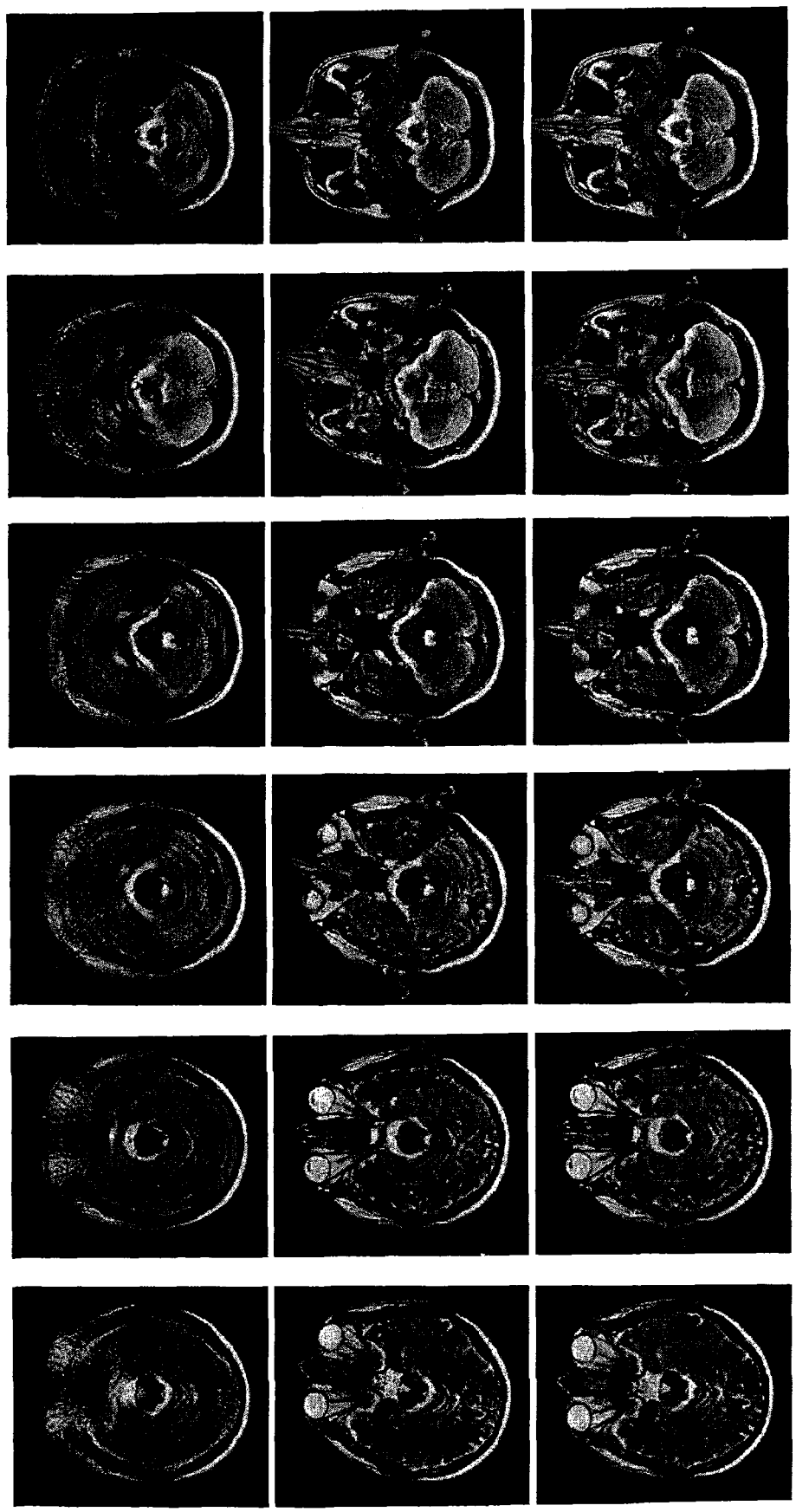
FIG. 9 shows various MR images without inter-slice movement correction and intra-slice movement correction, images with only intra-slice movement correction and images with both movement corrections.
Figure 10:
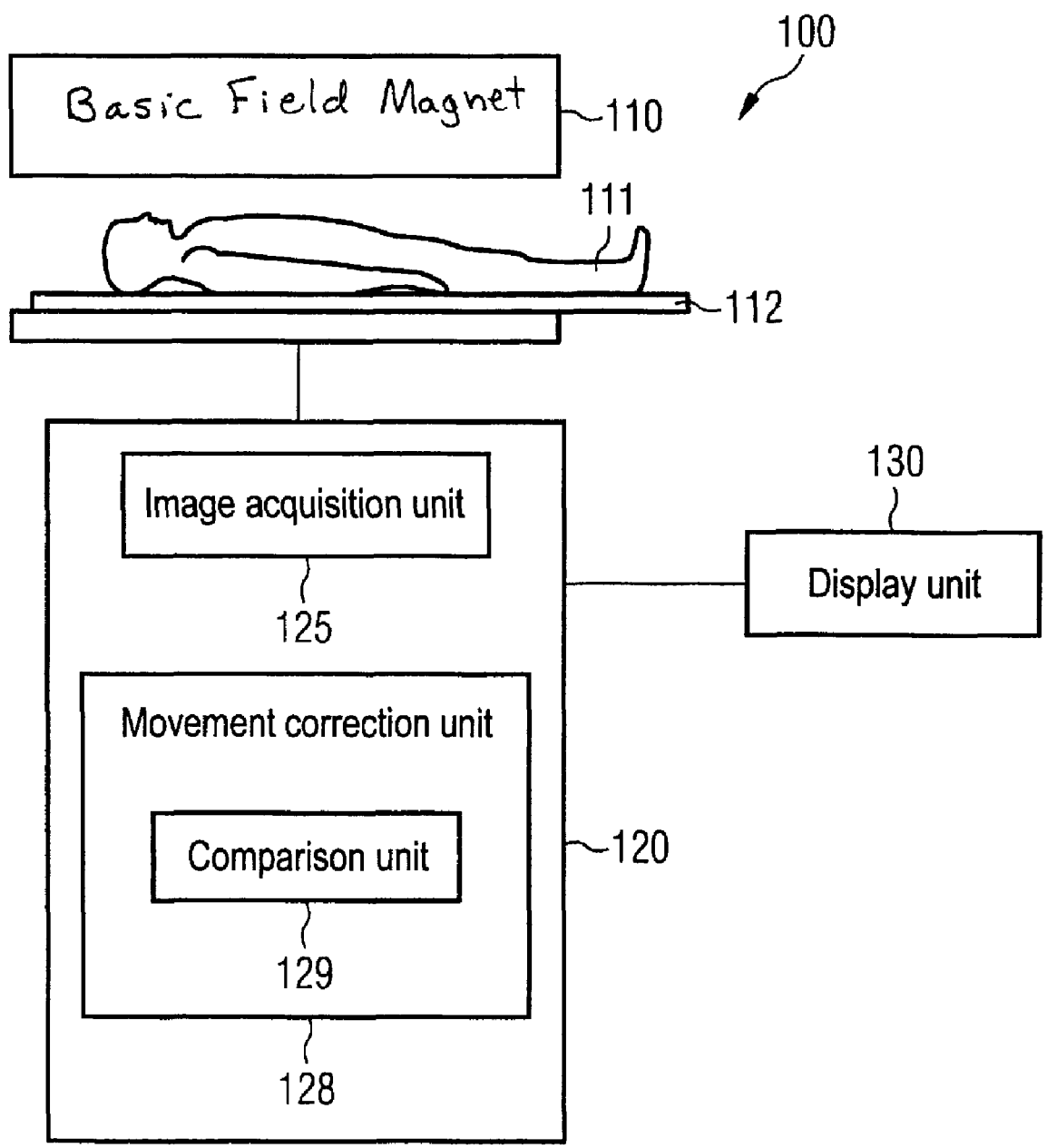
FIG. 10 schematically illustrates an MR system with which a movement correction method according to the invention can be implemented.

The mode of operation of the described method is presented in connection with FIGS. 8 and 9. FIGS. 8*a*-8*d* show eight MR images of a head of an examined person. Each image shows the image as it was reconstructed from the data of the intersection region 40 of a single segment. The vertical direction shown in FIG. 8 is the slice direction. The index n numbers the slice position as shown in FIG. 1, for example. The slices at the odd numbers one and three form the first group while the slices with the numbers n=2, 4 form the second group. In the images of the second group, the left images with the index i=0 show the reconstructed reference data set that was calculated from the respective adjacent images of the first group. In the shown example this means that image 82 was reconstructed from the images 81 and 85 via interpolation. The images 83 and 87 show the images that were reconstructed from the intersection region of the actual measured first segment of the slice n=2 and n=4. As is recognizable from these images, the examination subject has moved between the acquisition of the segments of the first group and second group, as is detectable due to the rotation of the shown head in the clockwise direction. The images of the second group (i.e. the images 82 and 83 or, respectively, the images 86 and 87) are then compared with one another in order to identify the movement that occurred in-between. The images 84 and 88 shown on the right side show the images of the middle column (83 and 87) after the inter-slice movement correction in which the movement found via the comparison of the images 82/83 or 86/87 was corrected. As can be seen from the images 84 and 88, the occurred movement could be largely corrected, such that the images 84 and 88 are essentially anatomically correctly aligned with the images 81 and 85.

A further example of the application of the method according to the invention is shown in FIG. 9. In the representation of FIG. 9, T2-weighted head images were acquired with a turbospin echo PROPELLER imaging sequence. For demonstration purposes the examined person has shaken his head in the acquisition, as results from the left column of the shown images. The vertical direction is again the slice direction. The images in one row were calculated from the same data. The intra-slice movement correction and the inter-slice movement correction were not used in the left column. Only the intra-slice movement correction was applied in the images in the middle column while the intra-slice movement correction and the inter-slice movement correction were used for the images in the right column. As can be seen from the images in FIG. 9, the images in the middle column are already free of movement; however, every second image is shown rotated relative to the direct neighbors. In the images in the right column it is recognizable that the rotation still present in the middle column was likewise corrected.

As can be seen in the examples from FIGS. 8 and 9, the occurred movement can be reduced in an effective manner.

If the total number of slice is now odd and if the odd slices are acquired first, each slice n of the second group has two direct nearest neighbors. However, if the total number of the slices is even, one slice of the second group has only one nearest neighbor, for example the last slice if the odd-designated slices are acquired first or the first slice if the even slices are acquired first. An extrapolation would thus be necessary for the generation of an artificial reference data set for the inter-slice movement correction. However, an extrapolation is generally more difficult and error-prone than an interpolation, such that the inter-slice movement correction cannot be implemented for this slice. Due to the short time interval between the excitation of slices of the same group, in this case the result of the inter-slice movement detection of the next slice of this group (that is positioned between two slices of group 1) can be used for the inter-slice movement correction of the edge slice, for example. This procedure can also be reasonable for such edge slices that are located between slices of the first group since the anatomy generally changes spatially more quickly at the edge of the slice stack and thus the generated reference data set deviates more significantly from the actual measured data than inside the stack.

The described method generally delivers good results if the slices of a group were acquired in a fast temporal sequence since it is presumed that no movement occurs between the acquisition of these slices. In the event that, for technical reasons of the sequence, the repetition time TR is longer than a minimal possible repetition time, this fill time $TR_{Fill}=TR-TR_{Min}$ is typically uniformly distributed over the various excitations. However, this extends the time span between the excitation of two slices of the same group. However, this is disadvantageous for the method of the present invention. Given an acquisition scheme as it is shown in FIG. 2, in a preferred embodiment of the invention the entire fill time $TR_{Fill}$ is inserted either at the end of the TR interval after the excitation of the last slice of the respective group or before the excitation of the first slice of the respective group. In the embodiment of FIG. 3 a first half of the fill time is preferably inserted after the excitation of the slices of the first group and the second half of the fill time is inserted after the excitation of the slices of the second group. The time between the excitation of adjacent slices of a group is thereby minimized and the time between the excitation of directly adjacent slices (that are associated with different groups) is thereby maximized.

In summary, the present invention enables an inter-slice movement correction with which movements that occur in a time span between the excitation and data acquisition of a first slice and the excitation and data acquisition of another slice at a later point in time can also be identified and corrected.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for correcting movement artifacts in magnetic resonance images of an examination region of an examination subject, comprising the steps of:

acquiring magnetic resonance raw data from an examination region of an examination subject in multiple slices respectively located in a successive physical progression in said examination region by acquiring said raw data from at least two groups of said slices in a chronological acquisition progression that does not coincide with said physical progression, including acquiring raw data from at least one intervening slice in a second of said groups that is physically between respective successive slices in said physical progression for which raw data are acquired in a first of said groups, with said raw data from said intervening slice being acquired after a time span that follows the acquisition of said raw data from each of the respective successive slices;

identifying movement of the examination region that occurs in said time span by reconstructing a reference data set for said intervening slice from raw data of at least one slice in said first of said groups, and comparing said reference data set with said raw data of said intervening slice to obtain a comparison result that represents said movement; and reconstructing an image of said intervening slice from said raw data of said intervening slice and automatically correcting said image dependent on said movement represented by said comparison result to make said image substantially free of artifacts due to said movement.

2. A method as claimed in claim 1 comprising obtaining said raw data from slices of said first of said groups that spatially alternate with slices of said second of said groups.

3. A method as claimed in claim 2 comprising reconstructing said reference data set for said intervening slice from raw data acquired respectively for two slices in said first of said group that are directly spatially adjacent to said intervening slice.

4. A method as claimed in claim 1 comprising acquiring said raw data from the slices in said first of said groups before acquiring the raw data for the slices in said second of said groups.

5. A method as claimed in claim 1 acquiring said raw data from slices in said first of said groups interleaved with acquiring said raw data with the slices in said second of said groups, so that at least one partial data set of a slice of said second of said groups is acquired temporally between acquisition of raw data of slices of said first of said groups.

6. A method as claimed in claim 1 comprising identifying said movement as being at least one of a translation or a rotation of said examination region, and correcting for said at least one of said translation or said rotation in the reconstructed image of said examination region.

7. A method as claimed in claim 1 comprising acquiring said raw data from said first of said groups and said second of said groups in the head of the examination subject as said examination region.

8. A method as claimed in claim 1 comprising entering said raw data into k-space for said slices in said first of said groups and said slices in said second of said groups using a radial sampling technique, with respective segments in k-space in respective segments for said slices, with said segments overlapping in a center region of k-space.

9. A method as claimed in claim 8 comprising reconstructing said reference data set for said intervening slice from data in k-space in respective segments in k-space representing slices in said first of said group that are adjacent to said intervening slice.

10. A method as claimed in claim 9 comprising reconstructing said reference data set for said intervening slice by interpolating data in k-space for said respective segments of said adjacent slices of said first of said groups.

11. A method as claimed in claim 10 comprising reconstructing said reference data set using portions of said segments of said adjacent slices.

12. A method as claimed in claim 8 comprising identifying said center region of k-space wherein said segments overlap, and reconstructing said reference data set for said intervening slice using data in k-space in said overlapping region for said adjacent slices.

13. A method as claimed in claim 12 comprising reconstructing said reference data set for said intervening slice by interpolating the k-space data of said adjacent slices in said overlapping region.

14. A method as claimed in claim 13 comprising performing said interpolation as a linear interpolation of the k-space data of the adjacent slices in said overlapping region.

15. A method as claimed in claim 8 comprising:
  determining an overlapping region of the segment in k-space representing said intervening slice;
  determining k-space data in said overlapping region for two slices in said first of said groups that are adjacent to said intervening slice; and
  transforming said overlapping regions of said two slices in three-dimensional space and reconstructing said reference data set in three-dimensional space from the two overlapping regions transformed into three-dimensional space.

16. A method as claimed in claim 15 comprising reconstructing said reference data set in three-dimensional space by interpolating said two adjacent overlapping regions transformed into three-dimensional space.

17. A method as claimed in claim 16 comprising transforming said reconstructed reference data set back into k-space from three-dimensional space, and making said movement correction in k-space.

18. A method as claimed in claim 1 comprising reconstructing said reference data set for said intervening slice by interpolating raw data respectively for slices in said first of said group that are adjacent to said intervening slice.

19. A method as claimed in claim 18 comprising generating high-resolution magnetic resonance images for said slices in said first of said group using an entirety of k-space data, and using said high-resolution magnetic resonance images to reconstruct said reference data set for said intervening slice.

20. A method as claimed in claim 19 comprising reconstructing said reference data set by interpolating data in two high-resolution magnetic resonance images in said first of said groups that are adjacent to said intervening slice.

21. A method as claimed in claim 1 comprising correcting for intra-slice movement in said time span.

22. A method as claimed in claim 1 comprising entering said raw data into k-space for said slices in said first of said groups and said slices in said second of said groups using a radial sampling technique, with respective segments in k-space in respective segments for said slices, with said segments overlapping in a center region of k-space, and correcting for said intra-slice movement by comparing each segment for said intervening slice with a reference segment for said intervening slice, and generating said reference segment by correcting for said movement with a reconstructed segment of said intervening slice.

23. A magnetic resonance system for correcting movement artifacts in magnetic resonance images of an examination region of an examination subject, comprising the steps of:
  a magnetic resonance data acquisition unit;
  a control unit that operates said magnetic resonance data acquisition unit to acquire magnetic resonance raw data from an examination region of an examination subject in multiple slices respectively located in a successive physical progression in said examination region by acquiring said raw data from at least two groups of said slices in a chronological acquisition progression that does not coincide with said physical progression, including acquiring raw data from at least one intervening slice in a second of said groups that is physically between respective successive slices in said physical progression for which raw data are acquired in a first of said groups, with said raw data from said intervening slice being acquired after a time span that follows the acquisition of said raw data from each of the respective successive slices;
  a correction unit configured to identify movement of the examination region that occurs in said time span by reconstructing a reference data set for said intervening slice from raw data of at least one slice in said first of said groups, said correction unit comprising a comparator that compares said reference data set with said raw data of said intervening slice to obtain a comparison result that represents said movement; and
  a comparator that reconstructs an image of said intervening slice from said raw data of said intervening slice and automatically corrects said image dependent on said movement represented by said comparison result to make said image substantially free of artifacts due to said movement.

24. A magnetic resonance system as claimed in claim 23 wherein said correction unit identifies said movement as being at least one of a translation or a rotation of said examination region, and wherein said computer corrects for said at least one of said translation or said rotation in the reconstructed image of said examination region.

* * * * *